United States Patent [19]

Takahashi

[11] Patent Number: 4,890,332

[45] Date of Patent: Dec. 26, 1989

[54] APPARATUS FOR JUDGING QUALITY OF MOBILE DATA COMMUNICATION

[75] Inventor: Chusei Takahashi, Tokyo, Japan

[73] Assignee: Oki Electric Industry Co., Ltd., Tokyo, Japan

[21] Appl. No.: 223,117

[22] Filed: Jun. 27, 1988

Related U.S. Application Data

[63] Continuation-in-part of Ser. No. 877,452, Jun. 23, 1986, abandoned.

[30] Foreign Application Priority Data

Jun. 29, 1985 [JP] Japan .................................. 60-141537

[51] Int. Cl.$^4$ ............................................ H04B 17/00
[52] U.S. Cl. ........................................ 455/67; 455/226; 324/57 N
[58] Field of Search ....................... 455/67, 50, 52, 154, 455/156, 226, 228, 63, 62, 56, 57, 303; 324/57 N

[56] References Cited

U.S. PATENT DOCUMENTS

| | | | |
|---|---|---|---|
| 4,234,964 | 11/1980 | Cieslak | 455/226 |
| 4,479,255 | 10/1984 | Geesen et al. | 455/226 |
| 4,619,002 | 10/1986 | Thro | 455/226 |
| 4,627,103 | 12/1986 | Fukuhara | 455/226 |
| 4,723,303 | 2/1988 | Koch | 455/226 |
| 4,731,586 | 3/1988 | Perkins | 455/226 |
| 4,736,453 | 4/1988 | Schloemer | 455/67 |

Primary Examiner—Robert L. Griffin
Assistant Examiner—Curtis A. Kuntz
Attorney, Agent, or Firm—Wenderoth, Lind & Ponack

[57] ABSTRACT

An apparatus for judging the quality of mobile data communication has: (1) a unit for amplifying an incoming electric wave and detecting the strength of the received electric field; (2) a data communication judgement unit for previously setting a limit of data communication, and comparing the reference value with an output from the electric field strength detector unit (3) a visible display unit for visually displaying the received electronicfield signal when the strength of the received electric field is more than the judgment reference value; (4) a digital output terminal for outputting a digital control signal to control a modem; and (5) an audible tone generator for producing a continuous tone or an intermittent tone from a speaker to clearly inform an operator of the quality of the data communication when the strength of the received electric field is less than the judgment reference value.

4 Claims, 7 Drawing Sheets

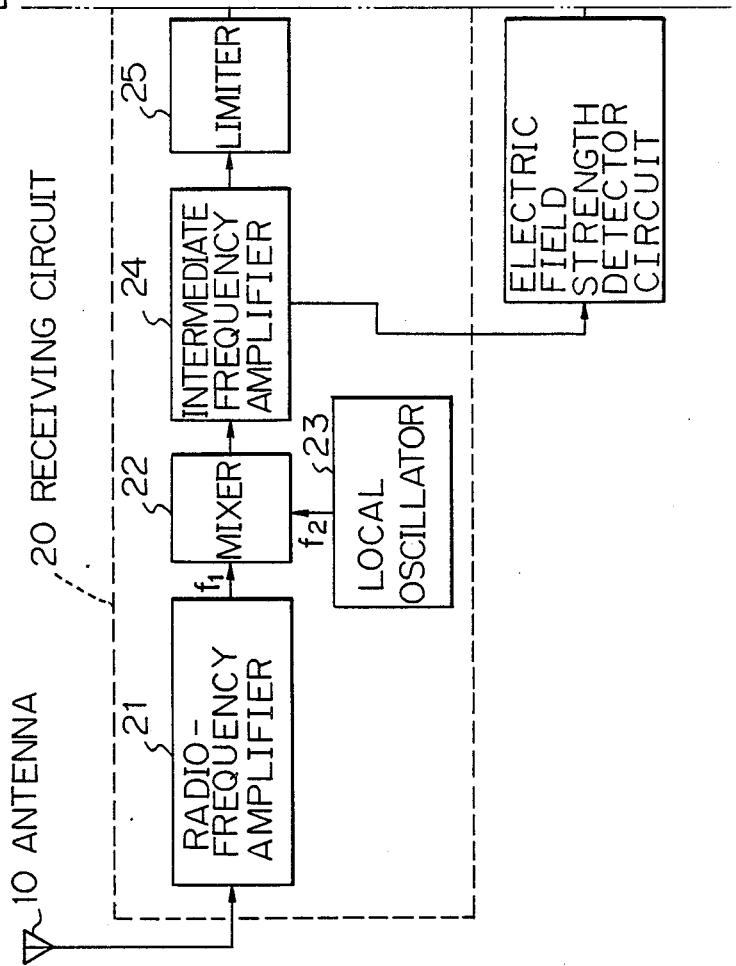

APPARATUS FOR JUDGING QUALITY OF MOBILE DATA COMMUNICATION

CROSS-REFERENCE TO RELATED APPLICATIONS

This application is a continuation-in-part of now abandoned application Ser. No. 877,452, filed June 23, 1986.

BACKGROUND OF THE INVENTION

1. Field of the Invention

The present invention relates to mobile communications and more particularly to an apparatus for judging the quality of data communication between a fixed station and various mobile units including automobiles and humans or data communication among mobile units.

2. Description of the Prior Art

Recent rapid progress of social and economical activities and diversifications thereof increasingly require telecommunication service to be qualitatively expanded as well as to be quantitatively improved.

Especially, such mobile communication plays an important role as a means capable of effecting communication at any time and from any place.

Mobile communication of this type has the following features in comparison with other communication means:

(1) Radio means is indispensable to mobile communications.
(2) Mobile communications can be established by combining a radio system, an exchange system, terminal equipment, parts technologies, etc.
(3) Applicable radio frequencies are limited.
(4) Radio-wave propagation is complicated.

Although in the mobile communication system a cell site is fixed, a mobile unit gets about. Accordingly, they do not necessarily afford unobstructed views of each other.

In particular, the visibility therebetween is sometimes bad along roads in an urban area due to buildings lying therebetween.

Moreover, a mobile station employs a non-directional antenna to make it possible to communicate with a cell site irrespective of its direction.

Accordingly, any radio-wave propagating between a mobile station and a cell site through spaces among many buildings in an urban district is complicated owing to the influences of reflected waves from surrounding building, so that traveling of a mobile unit causes the strength of a received electric wave to be widely varied.

The period of the variations of the radio-wave is associated with a travelling speed of a mobile unit as well as the radio frequencies used. With the faster traveling speed and with the higher frequency of the radio-wave used, a fading phenomenon with a more rapid period is produced.

For example, with a traveling speed of 40Km/H over a 800 MHz band, a received electric field is varied in time about thirty times in one second.

It is known from many efforts to investigate such radio-wave propagation that the strength of a received electric field in an urban area becomes lower as a mobile is further away from a cell site, and becomes a considerably lower value than a theoretical value on a radio-wave propagating along the plane ground having a good line of sight.

In effecting data communication under such a poor environment, a received electric wave was simply displayed on a display in an analog or digital manner up to now.

This raises no trouble in the case of a man-to-man communication since a user properly may judge the quality of conversational communication.

However, in applying the system to simply display a received signal or to display data communication, judgment by a user, even if suitable, may cause frequent digital code errors, and makes it difficult to satisfactorily establish data communication and assure good quality data communication.

Accordingly, many efforts to devise an apparatus for judging the quality of mobile data communications have been desired at present.

SUMMARY OF THE INVENTION

In view of the drawbacks with the conventional mechanism, it is an object of the present invention to provide an apparatus capable of judging the quality of mobile data communications with ease by providing a quality judgment reference of a data communication even for many and unspecified persons.

Another object of the present invention is to provide an apparatus capable of judging a data communication from a mobile unit to be good or bad based on the strength of a received electric field branched by a receiving circuit using a quality judgment means, and securely informing an operator of the condition of a mobile data communication by visually displaying the data when judging the communication to be good while subjecting the data to an audible tone when judging it to be bad.

To achieve the above objects, an apparatus to judge the quality of a mobile data communication in which the strength of a received electric wave is greatly varied is adapted to previously set the average strength of a received electric field corresponding to the limit of a code error correcting system of a receiving circuit for employing the set value as a reference to specify the quality of the mobile data communication. The apparatus is further adapted to amplify an electric wave incoming and varying momently in executing the data communication to detect the strength of a received electric field at that time and to thereby compare the strength with the reference value for judgment.

When the signal strength of the received electric field is more than the predetermined reference value of judgment, the apparatus effects a visible display since good data communication can then be assured, while when the signal strength is less than the predetermined reference value, the apparatus can securely inform the operator of the quality of the mobile data communication by producing an audible tone using a speaker, etc.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
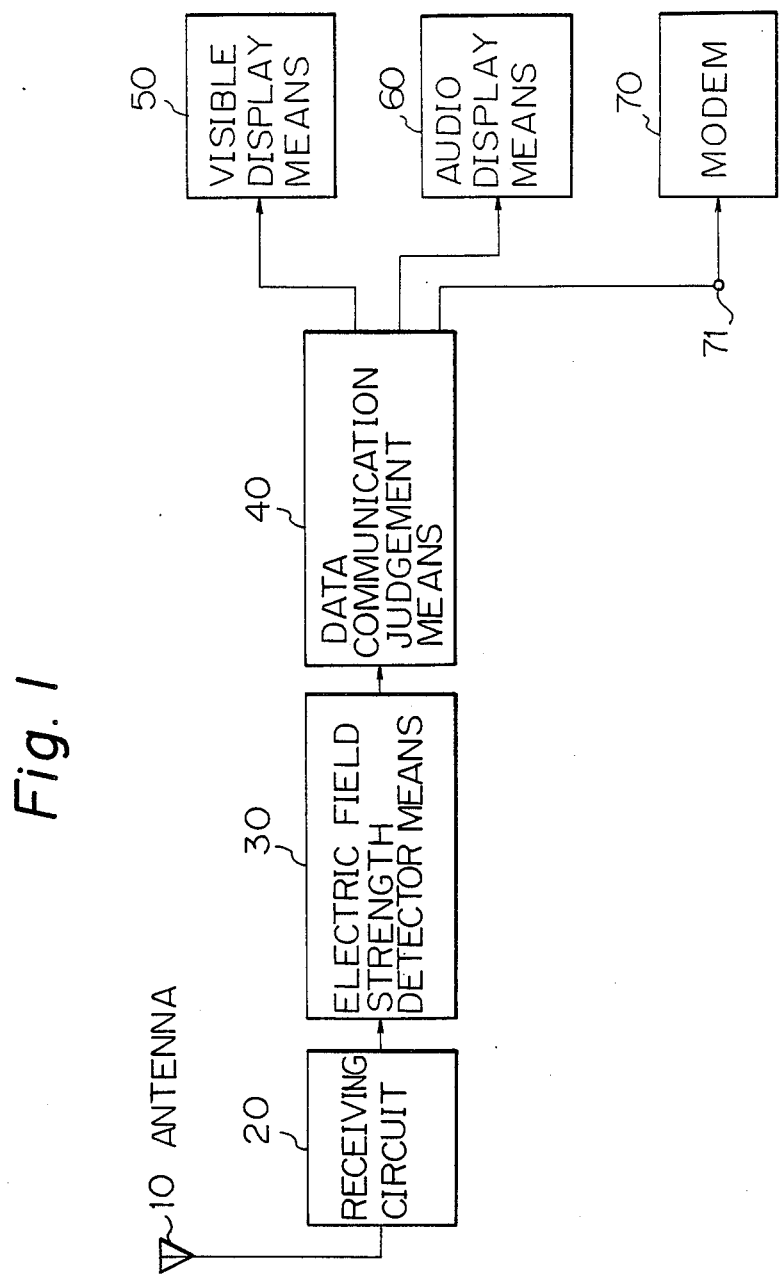
FIG. 1 is a block diagram illustrating a basic idea of an apparatus for judging the quality of mobile data communication according to the present invention.

Referring here to FIG. 1 illustrating a basic idea of an apparatus for judging the quality of mobile data communication according to the present invention, the operation of the apparatus will be described.

Designated, in the figure, at 10 is an antenna, 20 is a receiving circuit, 30 is an electric field strength detector means, 40 is means for judging the quality of data communication, 50 is display means for visually displaying the strength of a received electric-field, and 60 is audio display means for producing an audible tone, and 70 is a modem for data transmission.

A desired signal from among various signals coming from the antenna 10 is selected and amplified through the receiving circuit 20. The strength of the received electric field of the amplified signal is detected by the electric field strength detector means 30. The detected signal is, after being converted to a digital signal, subjected to sampling and arithmetic operational processing by the data communication judgment means 40 for evaluating an average value thereof.

The average value is compared with a predetermined judgment reference value in the data communication judgment means, and is subjected to a visual display by the display means such as an analog meter and a lamp, etc., when the received electric field strength is more than the judgment reference value, while producing an audible tone through the audible tone means, such as a speaker, etc., when the received electric field strength is less than the judgment reference value. Then, the data communication judgment means outputs a digital control signal via a digital output terminal 71 to control the data transmission conducted by the modem 70.

Figure 2B:
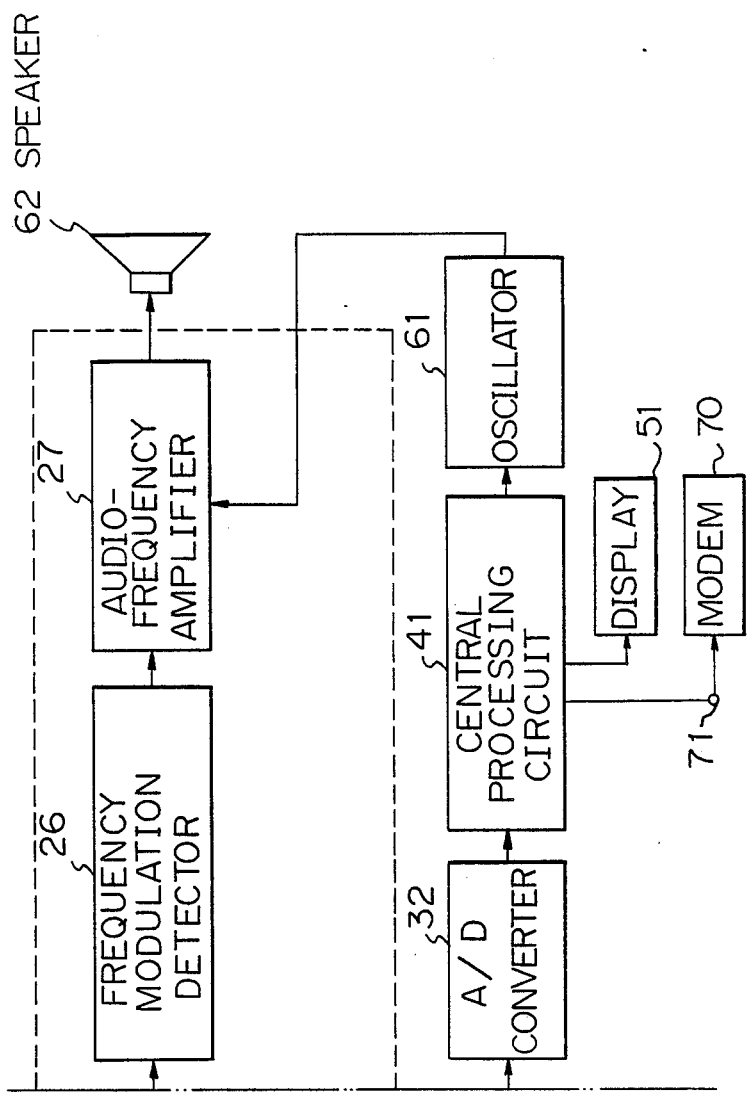
FIG. 2, consisting of FIGS. 2A and 2B, is a block diagram illustrating a preferred configuration of the present invention.

Each block of signal processing set forth above will be described in further detail with reference to FIG. 2 illustrating an embodiment of an apparatus for judging the quality of mobile data communication according to the present invention.

In FIG. 2, designated at 10 is an antenna, 20 is a receiving circuit, 21 is a radio-frequency amplifier, 22 is a mixer, 23 is a local oscillator, 24 is an intermediate frequency amplifier, 25 is a limiter, 26 is a frequency modulation detector, 27 is an audio-frequency amplifier, 31 is an electric field strength detector, 32 is an A/D converter, 41 is a central processing circuit, 51 is a display, 61 is an oscillator and 62 is a speaker, 70 is a modem for digital data transmission, 71 is a digital output terminal for outputting a digital control signal to control the modem 70.

The operation of the apparatus is as follows:

A desired signal from among various signals coming through the antenna is after being selected and amplified by the radio frequency amplifier 21, supplied to the mixer 22.

A signal of frequency f2 different from the received signal f1 from the local oscillator 23 is supplied to the mixer 22, and a beat phenomenon is produced between the received frequency f1 and the local oscillation frequency f2 to form a signal having frequencies including both the sum of the signals and the difference therebetween.

The difference part therebetween is taken out using a filter (not shown), and is supplied to the intermediate frequency amplifier 24 for amplification.

A FM signal is, although having a constant amplitude and a frequency changing in time, subjected to amplitude modulation owing to electrical noise and interferences among electric waves caused by multiple propagation on radio transmission paths to the antenna of the receiver, and is thus varied in its amplitude.

After being FM-detected, this signal as is, has noise components which are produced on a detected output to deteriorate sound quality, so the output is shaped to a constant amplitude FM signal through the limiter 25, and is thereafter demodulated through the frequency modulation detector 26 to provide a low frequency signal.

The low frequency signal is then amplified by the low frequency amplifier 27 to a level allowing it to drive the speaker.

The basic operation of the general FM receiving circuit 20 is as described above. In succession, let us describe the electric field strength detector circuit 31, the A/D converter 32, and the central processing circuit 41 with reference to FIG. 3.

Figure 3:
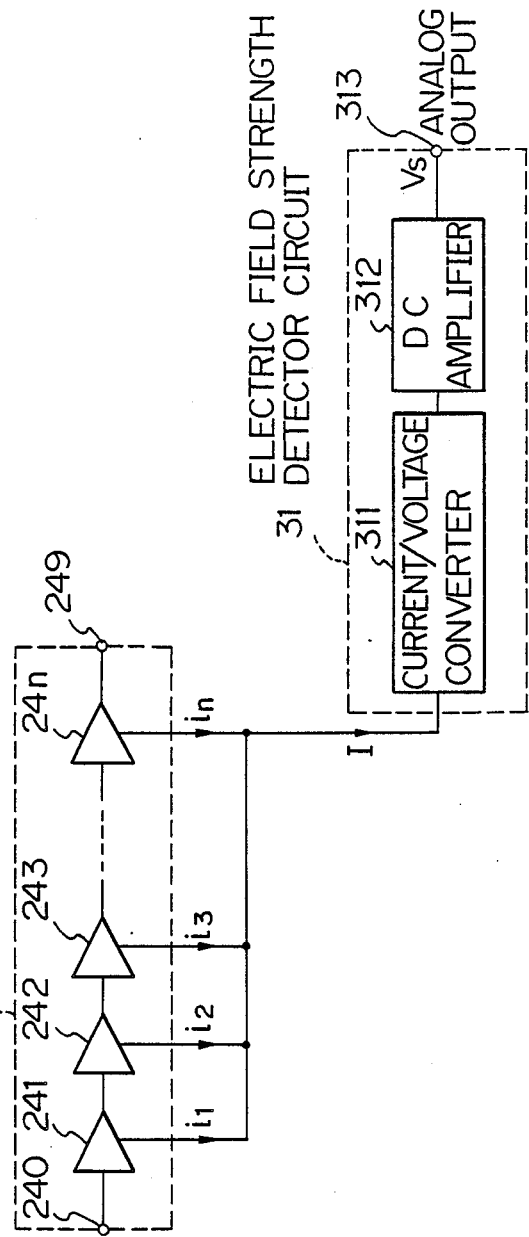
FIG. 3 is a block diagram illustrating in detail an intermediate frequency amplifier with a detector for detecting the strength of an electric field.

In FIG. 3, designated at 240 is an input terminal of the intermediate frequency amplifier, 241 to 24n are respective differential amplifiers, and 249 is an output terminal of the intermediate frequency amplifier.

Likewise, designated at 31 is the electric field strength detector circuit, 311 is a current to voltage converter, 312 is a DC amplifier circuit, and 313 is an output terminal of the electric field strength detector circuit.

The differential amplifiers 241 to 24n each comprising two transistors serve on one hand to amplify an intermediate frequency signal while serve on the other hand to detect the signal for obtaining signals $i_1$, $i_2$, $i_3$, ..., $i_n$ by making use of a diode function effected between a base and an emitter of a transistor of each differential amplifier.

Namely, the intermediate frequency signal is amplified through the differential amplifiers 241 to 24n in succession, while adapted to provide the detected currents $i_1$, $i_2$, $i_3$, ..., $i_n$ in as described above. These currents are then added to provide the sum:

$$I = i_1 + i_2 + i_3 + \ldots + i_n$$

The added current I is converted to voltage through the current/voltage converter circuit 311, and is amplified by the DC amplifier 312 and delivered to an analog output 313.

Figure 4:
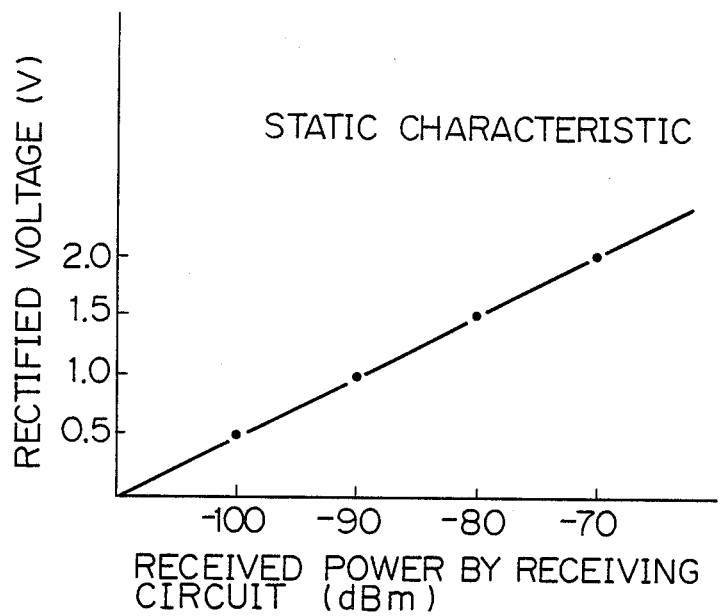
FIG. 4 is a graph exemplarily showing a static characteristic between electric power received by a receiving circuit and an output rectified and amplified by an electric field strength detector circuit.

FIG. 4 shows illustrative static characteristic of an output rectified and amplified through the electric field strength detector circuit with respect to the power received by the receiving circuit.

Figure 5:
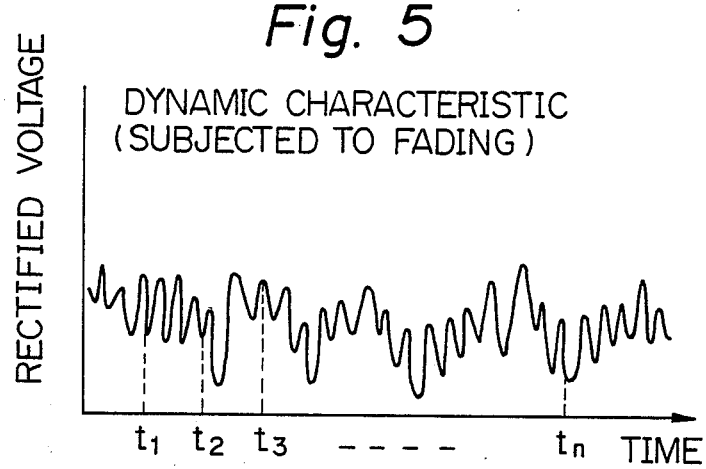
FIG. 5 is a graph exemplarily showing a dynamic characteristic of an output from the electric field strength detection with respect to time when a mobile unit travels.

FIG. 5 shows an illustrative dynamic characteristic of instantaneous variations of the rectified voltage when the electric wave is subjected to fading.

The output voltage $V_s$ rectified and amplified by the field strength detector circuit 31 is inputted into the A/D converter 32.

Figure 6:
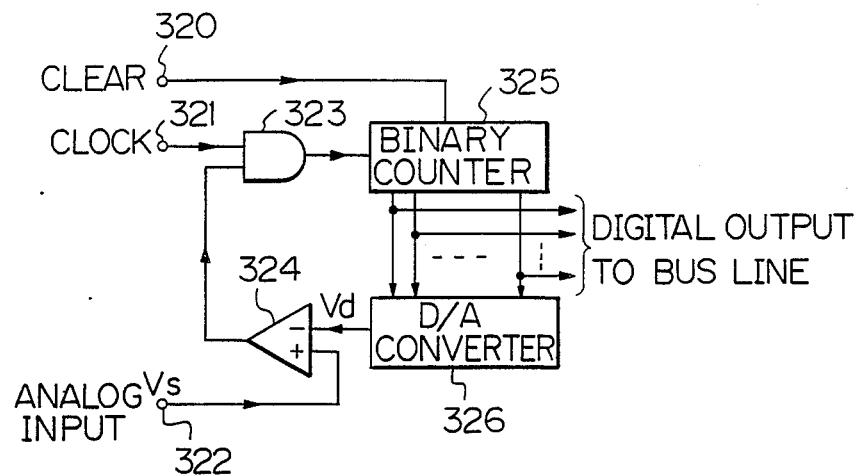
FIG. 6 is a detailed block diagram of an A/D converter.

An operation of the A/D converter will be described with reference to FIG. 6 illustrating the A/D converter in detail.

In FIG. 6, designated at 320 is a clear terminal for a binary counter, 321 is a clock input terminal, 322 is an input terminal for a signal rectified and amplified in the field strength detector circuit 31, 323 is an AND circuit, 324 is a comparator, 325 is a binary counter, and 326 is a D/A converter.

A clear pulse inputted from a clear terminal sets the binary counter 325 to 0. In succession, the counter counts clock pulses available from the clock input terminal in a binary format. Since the number of pulses so counted is linearly increased with the passage of time, a binary word constituting this count is employed as an output to a bus line and used as an input to the D/A counter, as shown in FIG. 6. An output of the comparator 324 becomes a high state when the analog input Vs from the field strength detector circuit is more than Vd, and the binary counter 325 thereby counts in successive count operations since the AND gate 323 allows a clock pulse supplied from the terminal 321 to pass therethrough. The comparator output changes to a low state as Vd exceeds Vs and the AND gate is thereby closed to stop the count operation of the binary counter 325.

Namely, when Vd substantially becomes equal to Vs, the output of the binary counter corresponds to the analog input voltage, which can be read as a digital word.

Figure 7:
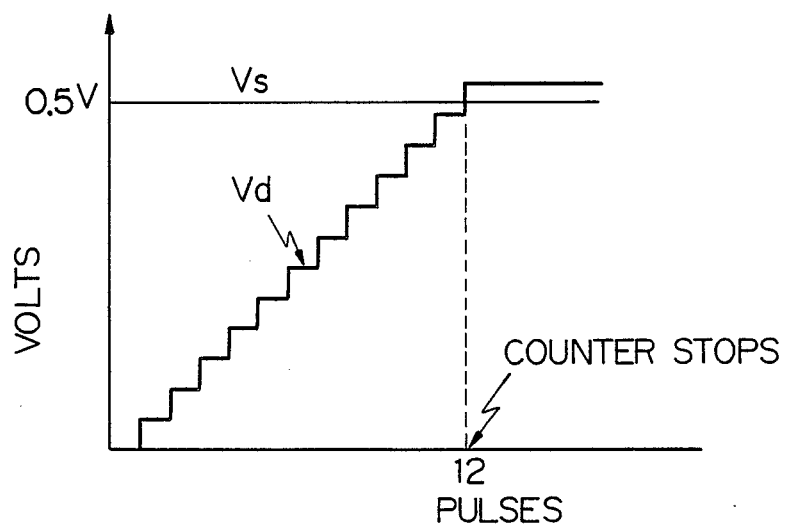
FIG. 7 is a graph illustrating an operation of the A/D converter.

FIG. 7 is an illustration showing a state of Vd increasing stepwise when 0.5 V is given as Vs.

Figure 8:
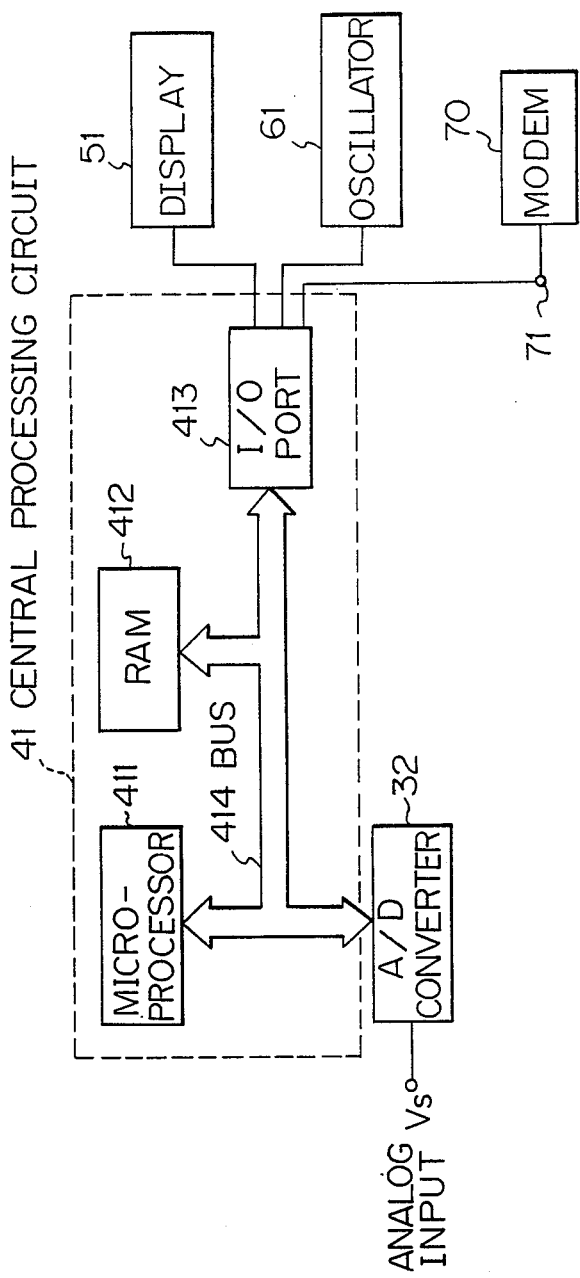
FIG. 8 is a block diagram illustrating an arrangement of a central processing circuit.

Let us describe operation of a central processing circuit 41 with reference to FIG. 8 depicting the arrangement of the central processing circuit 41.

As shown in FIG. 8, designated at 411 is a microprocessor serving to control the whole of the central circuit 41, 412 is a memory for storing instructions and data, 413 is an I/O port for controlling the operation of the display circuit 51 and the oscillator circuit 61, and 414 is a bus for delivering data among the devices described above and the A/D converter. The bus typically includes three kinds of buses, i.e. of data buses, i.e. address bus, and control bus.

The microprocessor reads an output from the A/D converter 32 via the bus and temporarily writes it in the RAM 412. Then, the microprocessor further reads an output from the A/D converter after the passage of a prescribed time, while reading the value written previously in the RAM, and after adding them, again stores the sum in the RAM. The microprocessor reads in such a manner an output from the A/D converter at about 2 msec intervals and adds it to the previous value, and further repeats these operations 256 times for evaluating the average value.

Here, an average value of the strength of received electric fields each corresponding to limit, of the apparatus employed in the data communication for correcting erroneous codes is assured to be 0.5 V in terms of the output voltage from the field strength detector circuit.

When an average so estimated by the addition in the microprocessor is more than 0.5 V, the microprocessor drives the display circuit 51 via the I/O port for lighting a lamp, etc., or turning it on and off for displaying, the average value using the visible display means 51.

By contrast, when the above average value is less than 0.5 V, the microprocessor drives the oscillator circuit 61 via the I/O port for causing a speaker to produce a continuous tone or an intermittent tone via the low frequency amplifier port, and thereby clearly informs an operator of the quality of the mobile data communication.

Further, when the above average value is less than 0.5 V, the microprocessor outputs a digital control signal defined as high level or low level voltage via the I/O port 413 and the digital output terminal 71 to control the modem 70.

When the modem 70 receives the digital control signal, the modem 70 stops or restricts its operations, for example, it stops to send carrier frequency signal of "fall-back" its data transmission rate.

Therefore, in a poor environment, when a received electric wave is so lower that the data error rate of the data transmission would be increased, the modem 70 stops its operation automatically.

Additionally, for such method to produce an audible tone, another method to produce a tone when the signal is more than the judgment reference value may be employed or another method to change a signal tone corresponding to the intensity of a received electric field may also be employed. In addition, for the oscillator circuit 61 for the speaker 62, the existing circuit in the mobile unit may be employed for achieving the object of the present invention.

According to the present invention as described above, a judgment reference to judge the strength of a received electric field corresponding to a limit of data communication is provided for judging the quality of the conditions of data communication, whereby a visual display is lighted or turned on and off when the strength is more than the judgment reference while an audible tone is produced from a speaker when the strength is less than the reference. Thus, when many and unspecified persons conduct data communications by making use of a general mobile radiophone or a public mobile phone in a mobile body, they can precisely be informed of the quality of the conditions of the communication by checking a display or giving audience to an audible tone. In addition, it is also possible, when a car is parked among troughs of electric fields (weak fields) to be received, to estimate a location to make data communication possible where the audible tone disappears by moving the car while listening to the audible tone.

Although a certain preferred embodiment has been shown and described, it should be understood that many changes and modifications may be made therein without departing from the scope of the appended claims.

What is claimed is:

1. An apparatus for judging a quality of mobile data communication, said apparatus being coupled to a modem which conducts the data communication, said apparatus comprising:
   (a) an electric field strength detector means for amplifying an incoming electric wave and for detecting a signal strength of the received electric field;
   (b) a data communication judgment means for comparing a predetermined judgment reference value of a communication limit in a data communication with an output from said electric field strength detector and for providing an output in response to the comparison;
(c) a display means for effecting a visible display when said signal strength of the received electric field is more than said predetermined judgment reference value;
(d) an audible tone means for producing an audible tone when said signal strength of the received electric field is less than said predetermined judgment reference value; and
(e) a digital output terminal means connected to said output of said data communication judgment means for outputting a predetermined digital control signal to the modem so as to control starting and stopping of the modem in response to the result of the comparison of the signal strength of the received electric field with the predetermined judgment reference value.

2. An apparatus for judging the quality of mobile data communication according to claim 1, wherein said electric field strength detector means rectifies an intermediate frequency signal into which the received signal is branched by an intermediate frequency amplifier means of a receiving circuit.

3. An apparatus for judging the quality of mobile data communication according to claim 1, wherein said data communication judgment means samples in repetition an output from the received electric field strength detector means for a predetermined period of time and subjects it to an arithmetic operation to average the samples and compares the result with said predetermined judgment reference value of a communication limit in a data communication.

4. An apparatus for judging a quality of mobile data communication, said apparatus being coupled to a modem which conducts the data communication, said apparatus comprising:
(a) an electric field strength detector means for producing a signal having a value corresponding to a signal strength of a received electric field;
(b) a data communication judgment means for sampling repeatedly said signal from said electric field strength detector means for a prescribed period of time and for subjecting it to arithmetic operation to average a result of the sampling, said data communication judgment means comparing the result with a predetermined judgment reference value of a communication limit in a data communication and for providing an output in response to the comparison;
(c) a visible display means for indicating that said average of the samples is higher than said predetermined judgment reference value in response to the result of the comparison by said data communication judgment means;
(d) an audible tone means for producing an audible tone to indicate that said average of the samples is equal to or less than said predetermined judgment reference value in response to the result of the comparison by said data communication judgment means; and
(e) a digital output terminal means connected to said output of the data communication judgment means for outputting a predetermined digital control signal to the modem so as to control starting and stopping of the modem in response to the result of the comparison of the signal strength of the received electric field with the predetermined judgment reference value.

* * * * *